United States Patent
Park

(10) Patent No.: US 12,396,351 B2
(45) Date of Patent: Aug. 19, 2025

(54) ELECTROLUMINESCENCE DISPLAY

(71) Applicant: LG Display Co., Ltd., Seoul (KR)

(72) Inventor: Taehan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 591 days.

(21) Appl. No.: 17/533,810

(22) Filed: Nov. 23, 2021

(65) Prior Publication Data

US 2022/0181391 A1 Jun. 9, 2022

(30) Foreign Application Priority Data

Dec. 8, 2020 (KR) .......................... 10-2020-0170213

(51) Int. Cl.
| | | |
|---|---|---|
| H10K 59/38 | (2023.01) | |
| H10K 50/856 | (2023.01) | |
| H10K 50/86 | (2023.01) | |
| H10K 59/80 | (2023.01) | |
| H10K 50/82 | (2023.01) | |
| H10K 59/122 | (2023.01) | |

(52) U.S. Cl.
CPC .......... H10K 59/38 (2023.02); H10K 50/856 (2023.02); H10K 50/865 (2023.02); H10K 59/878 (2023.02); H10K 59/8792 (2023.02); H10K 50/82 (2023.02); H10K 59/122 (2023.02); H10K 59/80515 (2023.02)

(58) Field of Classification Search
CPC .... H10K 59/38; H10K 50/856; H10K 50/865; H10K 50/82; H10K 59/122; H10K 59/878; H10K 59/8792; H10K 59/80515; H10K 59/124; H10K 59/351

See application file for complete search history.

(56) References Cited

U.S. PATENT DOCUMENTS

| 9,093,660 | B2 * | 7/2015 | Yang | .................... H10K 50/865 |
| 2003/0052869 | A1 * | 3/2003 | Fujii | ................. G02F 1/133555 |
| | | | | 345/204 |
| 2003/0201447 | A1 * | 10/2003 | Yamazaki | ............. H01L 25/167 |
| | | | | 257/79 |

(Continued)

FOREIGN PATENT DOCUMENTS

| CN | 1705417 A | * | 12/2005 | .......... H01L 27/3211 |
| CN | 103943658 A | * | 7/2014 | .......... H01K 59/124 |

(Continued)

OTHER PUBLICATIONS

Office Action dated Jun. 5, 2025 issued in corresponding Korean Patent Application No. 10-2020-0170213. (Note—KR 10-2015-0121896 A and KR 10-2017-0015732 A cited in this KR Office Action were cited in a PTO-892.).

*Primary Examiner* — Mohammed Shamsuzzaman

(74) *Attorney, Agent, or Firm* — Morgan, Lewis & Bockius LLP

(57) ABSTRACT

A disclosed electroluminescence display may include: a substrate; a driving element on the substrate; an anode electrode on the substrate and connected to the driving element; a bank on the anode electrode and defining an emission area at the anode electrode; a light emitting layer on the bank and the anode electrode; a cathode electrode on the light emitting layer; and a color temperature control layer between the anode electrode and the substrate in the emission area.

9 Claims, 6 Drawing Sheets

(56) References Cited

U.S. PATENT DOCUMENTS

| | | | |
|---|---|---|---|
| 2003/0222576 A1* | 12/2003 | Lu | H10K 59/38 313/504 |
| 2003/0222577 A1* | 12/2003 | Lu | H10K 59/38 313/504 |
| 2008/0284331 A1* | 11/2008 | Hayashi | H10K 50/8428 445/25 |
| 2013/0249383 A1* | 9/2013 | Yoo | H10K 59/8791 445/24 |
| 2017/0243932 A1* | 8/2017 | Ohara | H10K 59/124 |
| 2018/0006274 A1* | 1/2018 | Kim | H10K 59/122 |
| 2020/0161591 A1* | 5/2020 | Kim | H10K 50/85 |
| 2020/0185638 A1* | 6/2020 | Choi | H10K 59/122 |
| 2020/0194729 A1* | 6/2020 | Park | H10K 50/86 |
| 2020/0212275 A1* | 7/2020 | Choi | H01L 25/0753 |
| 2020/0212347 A1* | 7/2020 | Park | H10K 59/351 |
| 2022/0037420 A1* | 2/2022 | Jang | H10K 59/121 |
| 2022/0093678 A1* | 3/2022 | Lee | H01L 27/156 |
| 2022/0130810 A1* | 4/2022 | Park | H01L 25/0753 |
| 2022/0157917 A1* | 5/2022 | Park | H10K 59/1213 |
| 2023/0187582 A1* | 6/2023 | Noh | H01L 33/382 257/79 |
| 2023/0217671 A1* | 7/2023 | Chae | H10K 50/16 257/40 |
| 2023/0217795 A1* | 7/2023 | Lee | H10K 59/124 257/40 |

FOREIGN PATENT DOCUMENTS

| | | | | |
|---|---|---|---|---|
| CN | 108123057 A | * | 6/2018 | H01L 27/3244 |
| CN | 105590949 B | * | 5/2019 | H01L 27/3246 |
| EP | 3496146 A1 | * | 6/2019 | H01L 27/124 |
| EP | 3618122 A1 | * | 3/2020 | H01L 27/124 |
| EP | 3629377 A1 | * | 4/2020 | H01L 27/3211 |
| GB | 2544641 A | * | 5/2017 | H01L 27/3211 |
| JP | 2004006327 A | * | 1/2004 | H01L 27/3206 |
| JP | 2004063461 A | * | 2/2004 | H01L 27/3244 |
| KR | 10-2006-0055052 A | | 5/2006 | |
| KR | 2006055052 A | * | 5/2006 | H01L 51/5212 |
| KR | 20150121896 A | * | 10/2015 | H01K 50/858 |
| KR | 101679850 B1 | * | 11/2016 | H01L 23/145 |
| KR | 20170015732 A | * | 2/2017 | H01L 27/326 |
| KR | 10-2017-0064164 A | | 6/2017 | |
| KR | 10-2019-0024684 A | | 3/2019 | |
| KR | 10-2020-0058154 A | | 5/2020 | |
| WO | WO-2020071614 A1 | * | 4/2020 | B82B 3/0052 |
| WO | WO-2022074499 A1 | * | 4/2022 | H05B 33/02 |

* cited by examiner

ELECTROLUMINESCENCE DISPLAY

CROSS-REFERENCE TO RELATED APPLICATIONS

This application claims the benefit of and priority to Korean Patent Application No. 10-2020-0170213 filed on Dec. 8, 2020, which is hereby incorporated by reference as if fully set forth herein.

BACKGROUND

1. Technical Field

The present disclosure relates to a large area electroluminescence display. Especially, the present disclosure relates to an electroluminescence display having a structure in which the color temperature may be easily controlled. Further, the present disclosure relates to an electroluminescence display capable of easily adjusting color temperature and preventing or mitigating external light reflection without a polarizing element.

2. Description of the Related Art

Recently, various types of displays, such as cathode ray tubes (CRTs), liquid crystal displays (LCDs), plasma display panels (PDPs) and electroluminescent displays, have been developed. These various types of displays are used to display image data of various products, such as computer, mobile phones, bank deposit and withdrawal devices (ATMs), and vehicle navigation systems, according to their unique characteristics and purposes.

In particular, the electroluminescent display, which is a self-luminous display, has an excellent optical performance, such as a viewing angle and color realization degree, so that its application field is gradually widening and is receiving attention as an image display device. The electroluminescence display has excellent color reproducibility such that it is gaining more attention among the currently developed flat panel display devices. However, in order to adjust the color temperature differently according to the field of application, the characteristics of the light emitting material constituting the light emitting device should be variously controlled. It is very difficult to ensure the materials capable of providing various color temperature due to the characteristics of the light emitting device material. Therefore, there is a need to develop a technology capable of freely controlling the color temperature regardless of the types of light emitting materials used.

In addition, for the flat panel display device, such as an electroluminescence display, there is a problem in which external light is reflected and display quality is deteriorated. A method of adding an optical element such as a polarizer to suppress external light reflection has been proposed. However, since the amount of light provided by the light emitting material is reduced due to the optical element, the luminance of the display may be decreased. In order to prevent luminance degradation, higher power may be used, but it causes an increase in power consumption.

In particular, as the color temperature may be changed differently, the luminance may be reduced. In this case, the luminance may be further reduced due to the optical element for suppressing reflection of external light. Therefore, there is a need for developing a technology capable of freely controlling the color temperature and suppressing external light reflection without applying an additional optical element.

SUMMARY

Accordingly, the present disclosure is directed to an electroluminescence display that substantially obviates one or more problems due to limitations and disadvantages of the related art.

A purpose of the present disclosure, as for solving the problems described above, is to provide an electroluminescence display capable of variously adjusting the color temperature without further developing a light emitting element. Another purpose of the present disclosure is to provide an electroluminescence display capable of suppressing reflection of external light without lowering luminance. Still another purpose of the present disclosure is to provide an electroluminescence display capable of variously or freely adjusting the color temperature without changing a light emitting element, suppressing reflection of external light without applying an additional optical element, and preventing or mitigating a decrease in luminance.

In addition to the objects of the present disclosure as mentioned above, additional objects and features of the present disclosure will be clearly understood by those skilled in the art from the following description of the present disclosure.

To achieve these objects and other advantages and in accordance with the purpose of the present disclosure, as embodied and broadly described herein, an electroluminescence display may comprise: a substrate; a driving element on the substrate; an anode electrode on the substrate and connected to the driving element; a bank on the anode electrode and defining an emission area at the anode electrode; a light emitting layer on the bank and the anode electrode; a cathode electrode on the light emitting layer; and a color temperature control layer between the anode electrode and the substrate in the emission area.

In an example embodiment, an area ratio of the color temperature control layer to the emission area in a plan view may be 10% to 50%.

In an example embodiment, the color temperature control layer may have a plurality of island patterns arranged in the emission area.

In an example embodiment, the electroluminescence display may further comprise: a pattern layer; and a light absorbing electrode layer on the pattern layer, wherein the pattern layer and the light absorbing electrode layer are disposed between the light emitting layer and the cathode electrode.

In an example embodiment, the substate may include a plurality of pixels arranged in a matrix pattern, each pixel including a red subpixel, a green subpixel, a blue subpixel, and a white subpixel. The pattern layer may be disposed in the red subpixel, the green subpixel, the blue subpixel, and the white subpixel. The light absorbing electrode layer may be disposed at least in the white subpixel without being disposed in the blue subpixel.

In an example embodiment, the electroluminescence display may further comprise: light absorbing element disposed between the color temperature control layer and the substrate; and a light reflecting layer disposed between the light absorbing element and the color temperature control layer.

In an example embodiment, the electroluminescence display may further comprise a light absorbing electrode layer disposed between the light emitting layer and the cathode electrode without overlapping, in a plan view, with the light reflecting layer.

In an example embodiment, the light absorbing element may have a semi-spherical shape in a cross section with a curved top surface.

In an example embodiment, a ratio of a maximum area of the light absorbing element to the emission area in a plan view may be 10% to 90%.

In an example embodiment, the light reflecting layer may be disposed on the light absorbing element. The color temperature control layer may be disposed on a portion of the light reflecting layer.

In an example embodiment, the substrate may have a plurality of pixels arranged in a matrix pattern, each pixel including a red subpixel, a green subpixel, and a blue subpixel. The color temperature control layer may be disposed in at least one of the red subpixel and the green subpixel.

In an example embodiment, each pixel may further include a white subpixel, and the color temperature control layer may further be disposed in the white subpixel.

In an example embodiment, the color temperature control layer may include at least one of a first color conversion material to convert blue light to yellow light, a second color conversion material to convert blue light to red right, and a third color conversion material to convert blue light to green light.

In accordance with another aspect of the present disclosure, an electroluminescence display may comprise: a substrate including a plurality of pixel areas arranged in a matrix pattern, each pixel area including an emission area; a thin film transistor disposed outside the emission area in each pixel area; a planarization layer covering the substrate and the thin film transistor; a light absorbing element on the planarization layer in the emission area; a light reflecting layer on the light absorbing element; an anode electrode on the light reflecting layer in the emission area and connected to the thin film transistor; a bank on the anode electrode and defining the emission area; a light emitting layer on the anode electrode and the bank; and a cathode electrode on the light emitting layer.

In an example embodiment, the light absorbing element may have an area ratio of 50% to 90% to the emission area in the plan view.

In an example embodiment, the electroluminescence display may further comprise a color temperature control layer disposed between the light reflecting layer and the anode electrode.

In an example embodiment, the electroluminescence display may further comprise: a pattern layer between the light emitting layer and the cathode electrode; and a light absorbing electrode layer disposed between the pattern layer and the cathode electrode without overlapping, in a plan view, with the light absorbing element.

In an example embodiment, each pixel may have a red subpixel, a green subpixel, a blue subpixel, and a white subpixel, and the light absorbing electrode layer may be disposed at least in the white subpixel without being disposed in the blue subpixel.

In an example embodiment, the light absorbing element may have a semi-spherical shape in a cross section with a curved top surface.

In an example embodiment, an angle between a bottom surface and the curved top surface may be 200 to 70°.

In an example embodiment, the light absorbing element may have a plurality of island shapes arranged within the emission area.

In accordance with yet another aspect of the present disclosure, an electroluminescence display may comprise: a substrate including a plurality of pixel areas arranged in a matrix pattern, each pixel area including an emission area; a thin film transistor disposed outside the emission area in each pixel area; a planarization layer covering the substrate and the thin film transistor; a light absorbing element on the planarization layer in the emission area; a light reflecting layer on the light absorbing element; a color temperature control layer on the light reflecting layer in the emission area; an anode electrode on the color temperature control layer in the emission area and connected to the thin film transistor; a bank on the anode electrode and defining the emission area; a light emitting layer on the anode electrode and the bank; a pattern layer on the light emitting layer; light absorbing electrode layer on the pattern layer without overlapping, in a plan view, with the light absorbing element; and a cathode electrode on the pattern layer and the light absorbing electrode layer.

The electroluminescent display according to an example embodiment of the present disclosure may include a color temperature control layer under the light emitting element so that it is possible to change the color temperature of light emitted from the light emitting element without adjusting the physical properties of the light emitting element. In addition, the electroluminescence display according to an example embodiment of the present disclosure may include a light absorbing element and a light reflecting layer to prevent or mitigate reflection of external light with the light absorbing element and to maintain the light emitted from the light emitting layer in the light emitting regions with the light reflecting layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1:
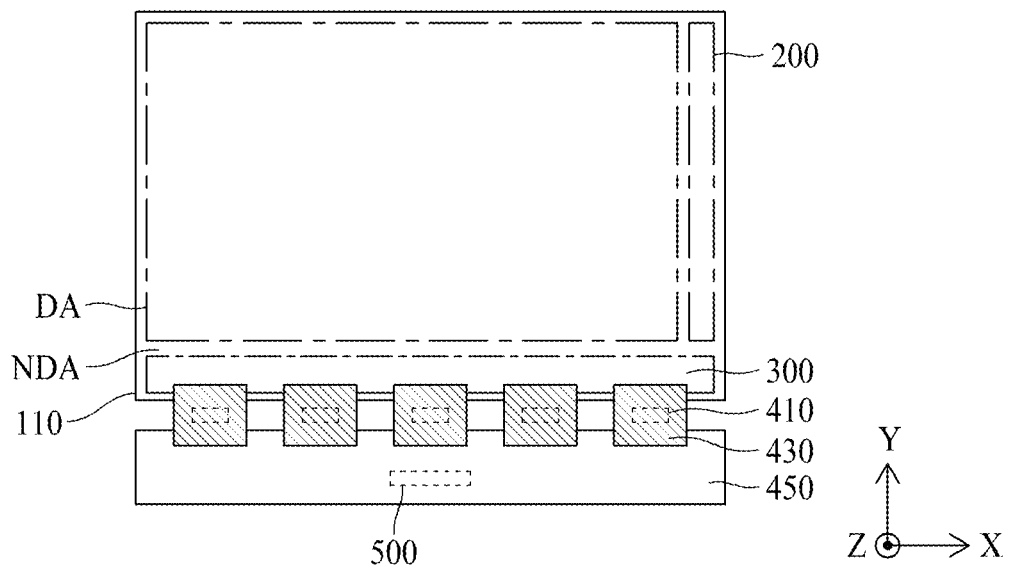
FIG. 1 is a diagram illustrating a schematic structure of an electroluminescence display according to an example embodiment of the present disclosure.

Reference will now be made in detail to the exemplary embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Wherever possible, the same reference numbers will be used throughout the drawings to refer to the same or like parts. In the specification, it should be noted that like reference numerals already used to denote like elements in other drawings may be used for elements wherever possible.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, an electroluminescence display device according to example embodiments of the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

FIG. 1 is a diagram illustrating a schematic structure of an electroluminescence display according to an example embodiment of the present disclosure. In FIG. 1, X-axis may be parallel to the extending direction of the scan line, Y-axis may be parallel to the extending direction of the data line, and Z-axis may represent the thickness direction of the display.

As shown in FIG. 1, the example electroluminescence display may comprise a substrate 110, a gate (or scan) driver 200, a data pad portion 300, a source driving IC (Integrated Circuit) 410, a flexible film 430, a circuit board 450, and a timing controller 500.

The substrate 110 may include an electrically insulating material or a flexible material. The substrate 110 may be made of a glass, a metal, or a plastic, but it is not limited thereto. For an example where the electroluminescence display is a flexible display, the substrate 110 may be made of the flexible material such as plastic. For example, the substrate 110 may include a transparent polyimide material.

The substrate 110 may include a display area DA and a non-display area NDA. The display area DA, which is an area for representing the video images, may be defined as the majority middle area of the substrate 110, but it is not limited thereto. In the display area DA, a plurality of scan lines (or gate lines), a plurality of data lines, and a plurality of pixels may be formed or disposed. Each of pixels may include a plurality of sub pixels. Each of sub pixels may include a scan line and a data line, respectively.

The non-display area NDA, which may be an area not representing the video images, may be defined at the circumference areas of the substrate 110 surrounding all or some of the display area DA. In the non-display area NDA, the gate driver 200 and the data pad portion 300 may be formed or disposed.

The gate driver 200 may supply the scan (or gate) signals to the scan lines according to one or more gate control signals received from the timing controller 500. The gate driver 200 may be formed at the non-display area NDA adjacent to any one or more sides of the display area DA on the substrate 110, for example, as a GIP (Gate driver In Panel) type. The GIP type means that the gate driver 200 is directly formed on the substrate 110.

The data pad portion 300 may supply the data signals to the data lines according to one or more data control signals received from the timing controller 500. The data pad portion 300 may be made as a driver chip and mounted on the flexible film 430. Further, the flexible film 430 may be attached at the non-display area NDA adjacent to any one or more sides of the display area DA on the substrate 110, for example, as a TAB (Tape Automated Bonding) type.

The source driving IC 410 may receive the digital video data and the source control signal(s) from the timing controller 500. The source driving IC 410 may convert the digital video data into the analog data voltages according to the source control signal(s) and then supply the analog data voltages to the data lines. In an example where the source driving IC 410 is a chip type, it may be installed on the flexible film 430 as a COF (Chip On Film) or COP (Chip On Plastic) type.

The flexible film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 2:
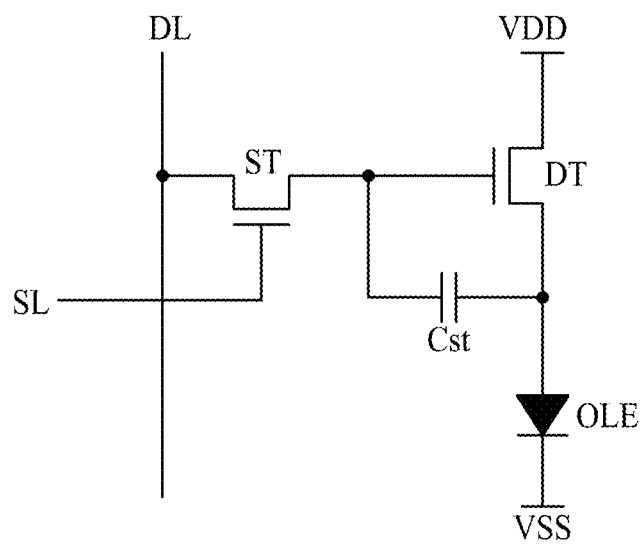
FIG. 2 is a circuit diagram illustrating a structure of one pixel according to an example embodiment of the present disclosure.
Figure 3:
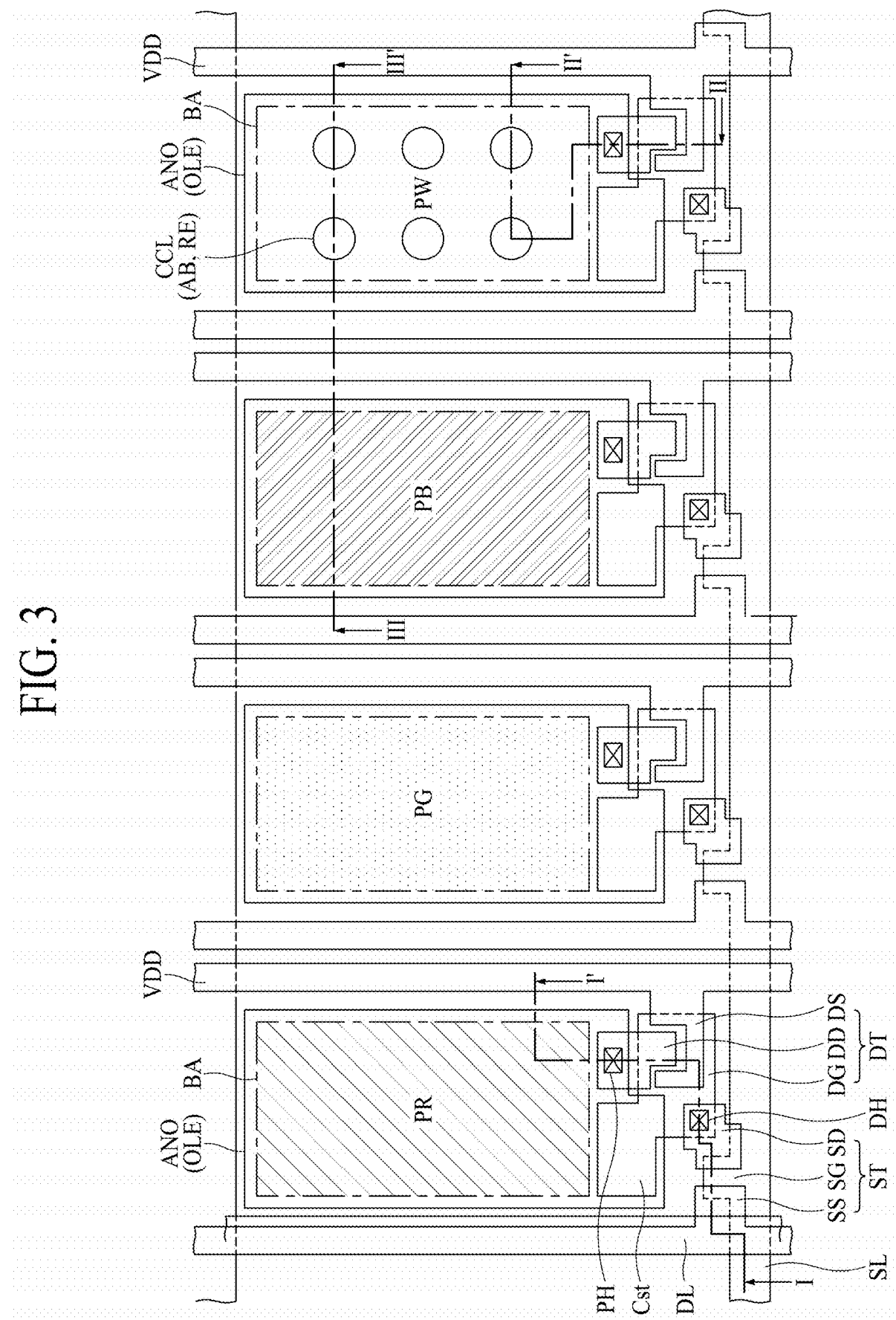
FIG. 3 is a plan view illustrating a structure of the pixels according to an example embodiment of the present disclosure.
Figure 4:
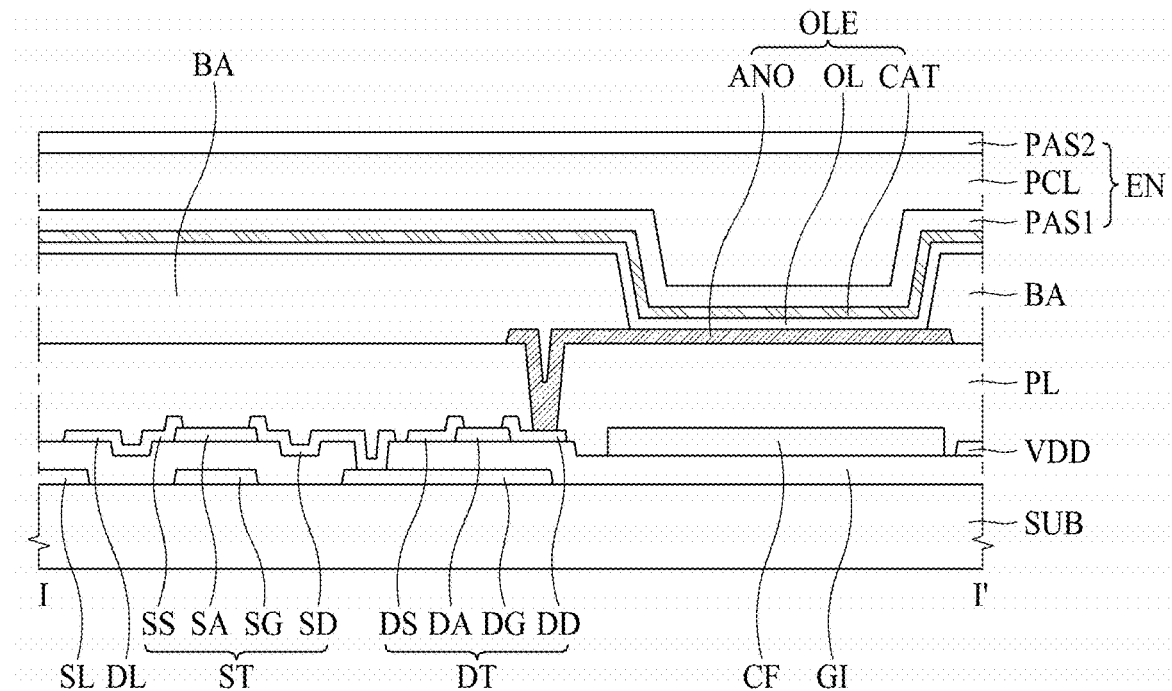
FIG. 4 is a cross-sectional view along the cutting line I-I' in FIG. 3, for illustrating the structure of the electroluminescence display according to an example embodiment of the present disclosure.

FIG. 2 is a circuit diagram illustrating a structure of one pixel according to an example embodiment of the present disclosure. FIG. 3 is a plan view illustrating a structure of the pixels according to an example embodiment of the present disclosure. FIG. 4 is a cross-sectional view along the cutting line I-I' in FIG. 3, for illustrating the structure of the electroluminescent display according to an example embodiment of the present disclosure. With reference to FIGS. 2 to 4, an example embodiment of the present disclosure will be described in the context of an organic light emitting display, an example embodiment of a luminescence display apparatus.

As illustrated in FIGS. 2 to 4, one pixel P of the example light emitting display may be defined by a scan line SL, a data line DL, and a driving current line VDD. One pixel of the light emitting display may include a switching thin film transistor ST, a driving thin film transistor DT, a light emitting diode OLE, and a storage capacitance Cst. The driving current line VDD may be supplied with a high-level voltage for driving the light emitting diode OLE.

A switching thin film transistor ST and a driving thin film transistor DT may be formed on a substrate SUB. For example, the switching thin film transistor ST may be disposed at the portion where the scan line SL and the data line DL cross each other. The switching thin film transistor ST may include a switching gate electrode SG, a switching source electrode SS, and a switching drain electrode SD. The switching gate electrode SG may be connected to the scan line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light diode OLE of the pixel selected via the switching thin film transistor ST. The driving thin film transistor DT may include a driving gate electrode DG, a driving source electrode DS, and a driving drain electrode DD. The driving gate electrode DG may be connected to the switching drain electrode SD of the switching thin film transistor ST. The driving source electrode DS may be connected to the driving current line VDD, and the driving drain electrode DD may be connected to an anode electrode ANO of the light emitting diode OLE. A storage capacitance Cst may be disposed between the driving gate electrode DG o the driving thin film transistor DT and the anode electrode ANO of the light emitting diode OLE.

As shown in FIG. 4, the switching thin film transistor ST and the driving thin film transistor DT may have a bottom gate structure in which the gate electrode SG and DG are first formed on the substrate SUB. In this case, the gate insulating layer GI may be deposited on the gate electrodes SG and DG, and the semiconductor layer SA and DA may be formed on the gate insulating layer GI. Further, at the side ends of the semiconductor layer SA and DA, the source electrodes SS and DS and the drain electrodes SD and DD may be formed, respectively. However, the present disclosure is not limited thereto. The switching thin film transistor ST and the diving thin film transistor DT may have other alternative structures, such as a top gate structure in which the semiconductor layer may be first formed on the substrate SUB before the gate electrodes SG and DG.

The planarization layer PL may be deposited on or over the switching thin film transistor ST and the driving thin film transistor DT. The planarization layer PL may be provided to make the top surface of the substrate including the thin film transistors ST and DT more even or flatter. The planarization layer PL may be made of an organic material for ensuring the flatness of the top surface of the substrate SUB. Alternatively, the planarization layer PL may have a multi-layered structure in which at least one inorganic layer and at least one organic layer are alternately stacked.

The driving thin film transistor DT may be disposed between the driving current line VDD and the light emitting diode OLE. The driving thin film transistor DT may control the amount of electric current flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, a light emitting layer OL, and a cathode electrode CAT. The light emitting diode OLE may emit light according to the amount of the electric current controlled by the driving thin film transistor DT. In other words, the light emitting diode OLE may be driven by the voltage difference between the low-level voltage and the high-level voltage controlled by driving thin film transistor DT.

The anode electrode ANO may be formed on the planarization layer PL covering the thin film transistors ST and DT. The anode electrode ANO may be connected to the driving drain electrode DD of the driving thin film transistor DT through a contact hole formed in the planarization layer PL. A bank BA may be formed on the anode electrode ANO. The bank BA may define the emission area at the anode electrode ANO by covering the edges of the anode electrode ANO and exposing most central area of the anode electrode ANO.

The light emitting layer OL may be deposited on the top surfaces of the bank BA and the exposed portions of the anode electrode ANO. The light emitting layer OL may include an organic or inorganic material capable of generating light. The light emitting layer OL may be stacked as covering the entire display area DA on the substrate SUB. Alternatively, the light emitting layer OL may be deposited as separated portions, each corresponding to a respective emission area defined by the bank BA and contacting a respective anode electrode ANO.

The cathode electrode CAT may be deposited on the light emitting layer OL. The light emitting diode OLE may be formed by the stacking structure of the anode electrode ANO exposed by the bank BA, the light emitting layer OL contacting the anode electrode ANO, and the cathode electrode CAT.

The electroluminescence display according to an example embodiment of the present disclosure may have a structure of the bottom emission type in which the light generated from the light emitting diode OLE radiates in the direction toward the substrate SUB having the thin film transistors ST and DT. In this case, the color filter CF may be further formed under the light emitting diode OLE. For example, the color filter CF may be formed as corresponding to the emission area after forming the thin film transistors ST and DT. After that, the planarization layer PL may be deposited to cover the thin film transistors ST and DT and the color filter CF. However, the present disclosure is not limited thereto. In another example, the electroluminescence display may have a top emission structure in which the light emitted from the light emitting diode OLE may radiate in the direction toward the encapsulation layer EN formed on the light emitting diode OLE. In that case, the color filter CF may be disposed on or over the light emitting diode OLE.

The encapsulation layer EN may be formed over the substrate SUB having the light emitting diode OLE disposed thereon. The encapsulation layer EN may be provided to protect the light emitting diode OLE from foreign materials introduced from the external environment.

The encapsulation layer EN may include at least one inorganic layer and at least one organic layer. In one example, the encapsulation layer EN may be formed by sequentially stacking the first inorganic layer PAS1, the organic layer PCL and the second inorganic layer PAS2. The first inorganic layer PAS1 and the second inorganic layer PAS2 may be for preventing the penetration of moisture and gas from the outside environment. The first inorganic layer PAS1 and the second inorganic layer PAS2 may be formed of one or more inorganic materials, such as the silicon oxide and silicon nitride. The organic layer PCL may include an organic material for covering the foreign materials.

Hereinafter, various example embodiments according to the present disclosure will be explained. The explanations may be focused on the layout structure of the main elements disposed in the pixel area.

<First Example Embodiment>

Figure 5:
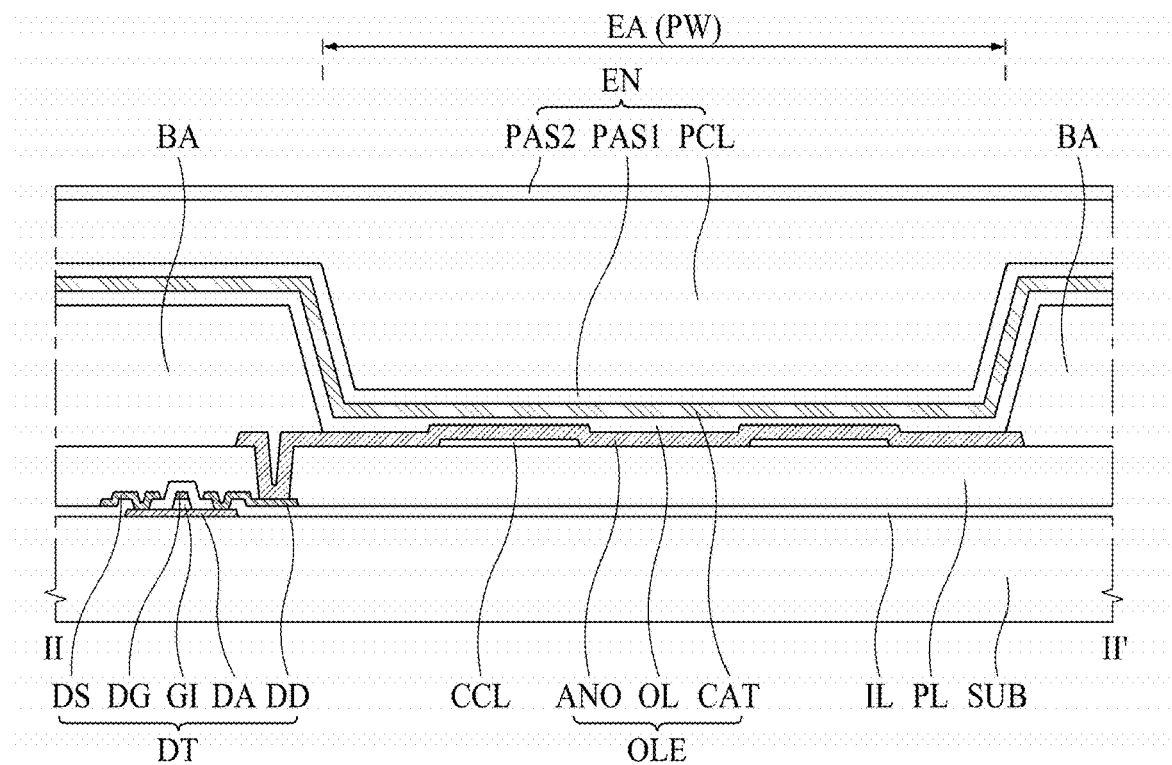
FIG. 5 is a cross-sectional view along the cutting line II-II' in FIG. 3, for illustrating a structure of the electroluminescence display according to the first example embodiment of the present disclosure.

With reference to FIGS. 3 and 5, the first example embodiment of the present disclosure will be explained. FIG. 5 is a cross-sectional view along the cutting line II-II' in FIG. 3, for illustrating a structure of the electroluminescent display according to the first example embodiment of the present disclosure.

As shown in FIG. 3, an electroluminescence display according to the first example embodiment of the present disclosure may have a plurality of pixels arranged in a matrix manner. Each pixel may include a plurality of subpixels. Hereinafter, the description is provided for an example in which one pixel may have a red subpixel, a green subpixel, a blue subpixel, and a white subpixel. However, the present disclosure is not limited thereto. In another example, one pixel may have three subpixels, including a red subpixel, a green subpixel, and a blue subpixel.

As shown in the cross-sectional structure illustrated in FIG. 5, the electroluminescence display according to the first example embodiment of the present disclosure may comprise a substrate SUB, a driving thin film transistor DT, a light emitting diode OLE, and a color temperature control layer CCL. FIG. 5 illustrates a structure of the white subpixel having a color temperature control layer CCL.

The driving thin film transistor DT may include a driving semiconductor layer DA, a gate insulating layer GI, a driving gate electrode DG, a driving source electrode DS and a driving drain electrode DD. The driving semiconductor layer DA may be formed on the substrate SUB. On the middle portion of the driving semiconductor layer DA, the gate insulating layer GI and the driving gate electrode DG may be formed. The intermediate insulating layer IL may be formed on the driving semiconductor layer DA and the driving gate electrode DG. The driving source electrode DS and the driving drain electrode DD may be formed on the intermediate insulating layer IL. The driving source electrode DS may contact one side of the driving semiconductor layer DA through a contact hole in the intermediate insulating layer IL. The driving drain electrode DD may contact the other side of the driving semiconductor layer DA through another contact hole in the intermediate insulating layer IL.

The planarization layer PL may be deposited on the substrate SUB having the driving thin film transistor DT disposed thereon. On the planarization layer PL, the color temperature control layer CCL may be formed within the emission area EA. The color temperature control layer CCL may have single layer structure formed within the emission area EA as having an island shape. Alternatively, as shown in FIG. 5, a plurality of color temperature control layers CCL, each of them having the island shape, may be arranged within an emission area.

On the planarization layer PL, the anode electrode ANO may be formed as having an area slightly larger than the emission area EA and covering the emission area EA. The anode electrode ANO may connect to the driving drain electrode DD of the driving thin film transistor DT through a contact hole penetrating the planarization layer PL. The anode electrode ANO may fully cover the color temperature control layer CCL.

As for the bottom emission type, the anode electrode ANO may be formed of a transparent conductive material. For example, the anode electrode ANO may include an indium-tin-oxide (or ITO) or an indium-zinc-oxide (or IZO).

The bank BA may be formed on the anode electrode ANO to define the emission area EA. The light emitting layer OL may be formed on the bank BA and the anode electrode ANO. For an example in which the light emitting layer OL emits the white light, the light emitting layer OL may be deposited as covering the entire display area DA of the substrate SUB.

The cathode electrode CAT may be formed on the light emitting layer OL. The cathode electrode CAT may have a single continuous layer structure as covering the entire pixel areas over the substrate SUB. For the case of the bottom emission type, the cathode electrode CAT may be made of a material with relatively high light reflectance. For example, the cathode electrode CAT may include silver (Ag), tantalum (Ta), copper (Cu), or aluminum (Al), or any alloy metal including one or more of these metals.

The light emitting diode OLE may be formed by the structure stacked with the anode electrode ANO, the light emitting layer OL, and the cathode electrode CAT which are disposed within the emission area EA defined by the bank BA.

The light from the light emitting layer OL may be reflected by the cathode electrode CAT and radiated toward the anode electrode ANO. Some amount of the light radiated may pass through the color temperature control layer CCL, and the remaining amount may not pass the color temperature control layer CCL. The portion of the light not passing through the color temperature control layer CCL may maintain the original color temperature. On the contrary, the color temperature of the portion of the light passing through the color temperature control layer CCL may be converted or changed. As a result, the color temperature of the overall light radiated from the emission area EA may be converted or changed.

For example, the color temperature control layer CCL may include a material for converting a blue light into a yellow light. The original (or standard) color temperature of the white color without color temperature control layer CCL may be 9969° C. However, for an example in which the material for converting the blue light into the yellow light is included, the color temperature may be 7379° C.

In one example, by adjusting the areal size of the color temperature control layer CCL to 10% of the areal size of the emission area EA, the color temperature of the light radiated from the emission area EA of the white subpixel may be controlled to 7379° C. In another example, by adjusting the areal size of the color temperature control layer CCL to 20% of the areal size of the emission area EA, the color temperature of the light radiated from the emission area EA of the white subpixel may be controlled to 5950° C.

As described above, the color temperature may be adjusted variously by the ratio of the area of the color temperature control layer CCL to the area of the emission area EA. However, the present disclosure is not limited thereto. Even with the same area ratio, the color temperature may be controlled or adjusted differently, for example, by varying the thickness of the color temperature control layer CCL or by varying the density of the color temperature conversion material included in the color temperature control layer CCL.

As shown in FIG. 3, one pixel may include red subpixel PR, a green subpixel PG, a blue subpixel PB, and a white subpixel PW. In FIG. 3, the color temperature control layer CCL may be disposed only at the white subpixel PW. In another example, the color temperature control layer CCL may be disposed at the green subpixel PG and the white subpixel PW, only. Alternatively, the color temperature control layer CCL may be disposed only at the red subpixel PR and the white subpixel PW. At yet another example, the color temperature control layer CCL may be disposed only at the red subpixel PR, the green subpixel PG, and the white subpixel PW. However, it is preferable that the blue subpixel PB may not include the color temperature control layer CCL. Since the blue light passing through the blue color filter may have significantly lower luminance than the light of other colors passing through the other color filters, the luminance may be further lowered in the event that the light having the color temperature lowered by passing the color temperature control layer CCL passes through the blue color filter.

The color temperature control layer CCL disposed at the red subpixel PR may include a color conversion material converting the blue light into the red light. The color temperature control layer CCL disposed at the green subpixel PG may include a color conversion material converting the blue light into the green light. In another example, the color temperature control layer CCL disposed at the white subpixel PW may include at least one of a color conversion material converting the blue light into the yellow light, a color conversion material converting the blue light into the red light, and a color conversion material converting the blue light into the green light.

In particular, the color temperature control layer CCL may be disposed at the white subpixel PW. Further, by adjusting, for example, the type of color conversion material used, the content of the color conversion material, and the area ratio of the color temperature control layer CCL to the area of the emission area EA, the color temperature of the light radiated from the white subpixel may be adjusted variously.

<Second Example Embodiment>

Figure 6:
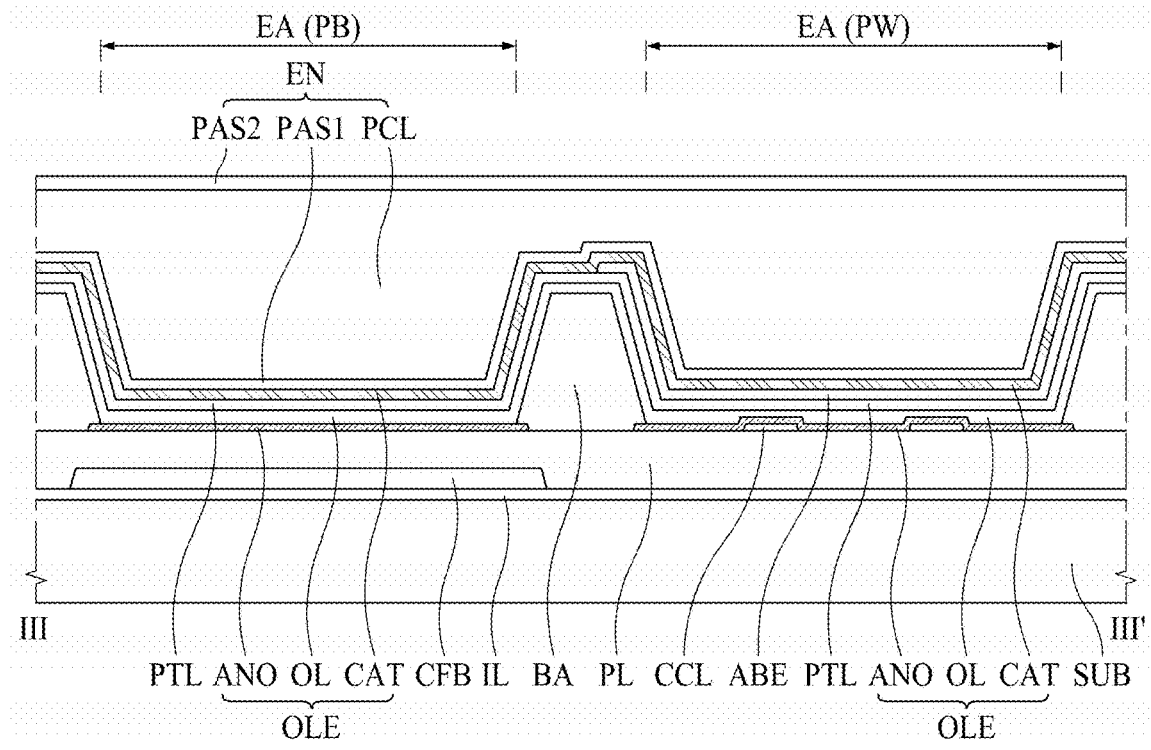
FIG. 6 is a cross-sectional view along the cutting line III-III' in FIG. 3, for illustrating a structure of the electroluminescence display according to the second example embodiment of the present disclosure.

Hereinafter, with reference to FIG. 6, the second example embodiment of the present disclosure will be described. FIG. 6 is a cross-sectional view along the cutting line III-III' in FIG. 3, for illustrating a structure of the electroluminescent display according to the second example embodiment of the present disclosure.

In the event that the external light from outside the substrate SUB (from below the substrate SUB in the orientation shown in FIG. 5) is incident on the cathode electrode CAT in the first example embodiment, the external light may be reflected by the cathode electrode CAT. In this case, due to the reflection of the external light, the video information provided from the display may not be correctly recognized by the user. In order to solve this potential problem, an optical element, such as a polarization sheet, may be added at the bottom surface of the substrate SUB in FIG. 5 to suppress the reflection of the external light.

An electroluminescence display according to the second example embodiment may have a feature in which the reflection of the external light may be suppressed without any additional optical element. As shown in FIG. 6, an electroluminescence display according to the second example embodiment of the present disclosure may include a blue subpixel PB and a white subpixel PW. The blue subpixel PB and the white subpixel PW may have different structures each other.

For example, the white subpixel PW may include a driving thin film transistor DT, a light emitting diode OLE, a color temperature control layer CCL, a pattern layer PTL, and a light absorbing layer ABE on a substrate SUB. The blue subpixel PB may include the pattern layer PTL, without including the color temperature control layer CCL or the light absorbing electrode layer ABE.

With reference to FIG. 6, the second example embodiment will be described in detail. At the white subpixel PW, the planarization layer PL may be deposited on the substrate SUB having the driving thin film transistor DT thereon. The color temperature control layer CCL may be deposited in the emission area EA of the white subpixel PW on the planarization layer PL. The color temperature control layer CCL may have a structure in which a plurality island patterns are arranged within the emission area EA of the white subpixel PW.

In addition, on the planarization layer PL, the anode electrode ANO may be formed as having a slightly larger area than the emission area EA and covering the emission area EA. The anode electrode ANO may fully cover the color temperature control layer CCL.

The bank BA may be formed on the anode electrode ANO and the planarization layer PL to define the emission area EA. The light emitting layer OL may be deposited to cover the display area DA of the substrate SUB on the bank BA and the anode electrode ANO.

The electroluminescence display according to the second example embodiment may have a structure for reducing the reflection of the external light at the white subpixel PW. For example, a reflection reduction element may be disposed on the light emitting layer OL. In one example, the reflection reduction element may have a structure in which the pattern layer PTL and the light absorbing electrode layer ABE are stacked.

The pattern layer PTL may include a transparent conductive material. The pattern layer PTL may have a property of adsorbing or not adsorbing a specific metal material on the surface of the pattern layer PTL, depending on whether or not ultra-violet (or UV) ray (or light) is irradiated. The pattern layer PTL may be disposed as a single layer covering all pixel areas over the substrate SUB. When an ultra-violet ray is irradiated to a predetermined region or regions on the surface of the pattern layer PTL, the light absorbing metal material may be laminated on the region(s) irradiated with the ultra-violet ray. However, the light absorbing metal material may not be laminated on the region(s) not irradiated with the ultra-violet ray.

For example, the pattern layer PTL may include an organic material, such as a material used in the electron transport layer or the electron injection layer of the light emitting layer OLE. In one example, the pattern layer PTL may include an organic material such as diarylethenes 1,2-bis[2-methyl-5-(5-trimethylsilylthiophen-2-yl)thiophen-3-yl]-3,3,4,4,5,5-hexafluorocyclopentene. In the event that this organic material is irradiated with an ultra-violet ray, the ring structure in the connection structure may be broken (open-ring), and the physical properties of the organic material may turn into a hard state. Conversely, in the event that visible light is irradiated on the organic material in a state in which the ring structure is broken, the connection structure may be recovered or reconnected (closed-ring) and the physical properties may turn into a soft state. However, the present disclosure is not limited this material. The pattern layer PTL may be formed of any organic material whose physical properties may be changed to hard or soft by changing the ring connection structure according to the wavelength of the irradiated light.

Metal may deposit well on a hard surface but may not be deposit well on a soft surface. As described above, because the pattern layer PTL may be made of the same material of the electron injection layer, in an example where the pattern layer PTL is disposed between the organic light emitting layer OL and the cathode electrode CAT and ultra-violet light and visible light are selectively irradiated, a metal layer may be partially or selectively deposited on the top surface of the pattern layer PTL.

In more detail, an organic material including diarylethenes 1,2-bis[2-methyl-5-(5-trimethylsilylthiophen-2-yl) thiophen-3-yl]-3,3,4,4,5,5-hexafluorocyclopentene may be deposited on the organic light emitting layer OL to form a pattern layer PTL. After that, ultra-violet light may be irradiated only at the white subpixel PW on the pattern layer PTL. For example, a mask exposing only the white subpixels PW may be used. Alternatively, ultra-violet light may be irradiated only at the white subpixel PW with a laser irradiating ultra-violet light. Then, in an example where an opaque light absorbing metal material is deposited, the light absorbing electrode layer ABE may be selectively deposited only on the white subpixel PW area where the ultra-violet light is irradiated. The light absorbing electrode layer ABE may include at least one of chromium (Cr), molybdenum (Mo), magnesium (Mg), titanium (Ti), or any alloy thereof.

The cathode electrode CAT may be deposited on the light absorbing electrode layer ABE. The cathode electrode CAT may be deposited to cover all the pixel areas over the substrate SUB.

The light emitting diode OLE may be formed by the stacking structure of the anode electrode ANO, the light emitting layer OL, and the cathode electrode CAT in the emission area EA defined by the bank BA. The white subpixel PW may have the pattern layer PTL and the light absorbing electrode layer ABE between the light emitting layer OL and the cathode electrode CAT. As the pattern layer PTL and the light absorbing electrode layer ABE may include a conductive material, they may be electrically connected to the cathode electrode CAT. That is, the pattern layer PTL, the light absorbing electrode layer ABE, and the cathode electrode CAT may be configured as one electrode element.

As a result, the light from the light emitting layer OL may be reflected by the cathode electrode CAT, and then radiated toward the anode electrode ANO. For example, 50% of the radiated light may go directly toward the anode electrode ANO, and the other 50% may go toward the cathode electrode CAT. The light going toward the cathode electrode CAT may be reflected by the cathode electrode CAT back toward the anode electrode ANO.

A portion of the light going toward the anode electrode ANO from the light emitting layer OL may pass through the color temperature control layer CCL, and another portion of the light may not pass the color temperature control layer CCL. The light not passing the color temperature control layer CCL may have the original color temperature of the material of the light emitting layer OL. On the contrary, the color temperature of the light passing through the color temperature control layer CCL may be converted or changed.

In the blue subpixel PB, the planarization layer PL may be deposited on the top surface of the substrate SUB having the driving thin film transistor DT. On the planarization layer PL, the anode electrode ANO may be formed to have a slightly larger area than the emission area EA and fully cover the emission area EA. The color temperature control layer CCL is not included in the pixel subpixel PB in this example.

The bank BA may be formed on the anode electrode ANO for defining the emission area EA. The light emitting layer OL may be deposited on the bank BA and the anode electrode ANO to cover the entire display area DA on the substrate SUB.

In the second example embodiment, the blue subpixel PB may not have the structure for reducing the reflection of external light. Therefore, the pattern layer PTL may be deposited on the light emitting layer OL in the blue subpixel PB, but the light absorbing electrode layer ABE is not deposited. As described above, the pattern layer PTL may be deposited as one continuous layer covering the entire pixel areas on the substrate SUB. However, in order not to form the light absorbing electrode layer ABE in the blue subpixel PB, ultra-violet light may be irradiated using a mask exposing the white subpixel PW area and blocking the blue subpixel PB area. After that, by depositing an opaque light absorbing metal material, the light absorbing electrode layer ABE may be selectively formed only in the white subpixel PW where ultra-violet light was irradiated. However, the light absorbing electrode layer ABE is not formed at the blue subpixel PB.

The cathode electrode CAT may be deposited on the pattern layer PTL in the blue subpixel PB. The cathode electrode CAT may be a single continuous layer covering the entire pixel areas on the substrate SUB.

In the blue subpixel PB, the light emitting diode OLE may include the anode electrode ANO, the light emitting layer OL, and the cathode electrode CAT sequentially stacked in the emission area EA defined by the bank BA. In particular, the pattern layer PTL may be disposed between the light emitting layer OL and the cathode electrode CAT. As the pattern layer PTL may include a transparent conductive material, it may be electrically connected to the cathode electrode CAT. That is, the pattern layer PTL and the cathode electrode CAT may be formed as one electrode element.

For example, 50% of the radiated light from the light emitting layer OL may go directly toward the anode electrode ANO, and the other 50% may go toward the cathode electrode CAT. The light going to the cathode electrode CAT may be reflected by the cathode electrode CAT back toward the anode electrode ANO.

All of the light going to the anode electrode ANO from the light emitting layer OL, directly or via the cathode electrode CAT, may go out through the substrate SUB. As there is no color temperature control layer CCL, the blue light may be radiated without a change in color temperature.

The electroluminescence display according to the second example embodiment may include the light absorbing electrode layer ABE in the white subpixel PW. Therefore, the external light incident on the white subpixel PW may be absorbed by the light absorbing electrode layer ABE before reaching the cathode electrode CAT so that there is no or less reflected light. That is, even without any additional optical element at the bottom surface (or the external surface) of the substrate SUB, the external light reflection may be suppressed.

Again, as shown in FIG. 3, one pixel may include a red subpixel PR, a green subpixel PG, a blue subpixel PB, and a white subpixel PW. With this example structure, the reflection of external light by the cathode electrode CAT may be more severe at the white subpixel PW where there is no color filter. Therefore, in this example, it is preferable that the light absorbing electrode layer ABE is disposed at least in the white subpixel PW. In addition, the light absorbing electrode layer ABE may be further disposed in the green subpixel PG where the reflection of external light may be relatively high. Further, the light absorbing electrode layer ABE may be further disposed in the red subpixel PR where the reflection of external light may be the next highest. However, the light absorbing electrode layer ABE may not be disposed in the blue subpixel PB where the reflection of external light is low.

In the white subpixel PW, the light radiated from the light emitting layer OL toward the cathode electrode CAT may be absorbed by the light absorbing electrode layer ABE before reaching the cathode electrode CAT. As a result, in the second example embodiment, about 50% of the light amount radiated at the white subpixel PW may be absorbed by the light absorbing electrode layer ABE so that the luminance of white subpixel PW may be reduced in half. However, as the light absorbing electrode layer ABE is disposed only in the white subpixel PW in this example, the reduction in the overall luminance of the pixel can be minimized.

<Third Example Embodiment>

Figure 7:
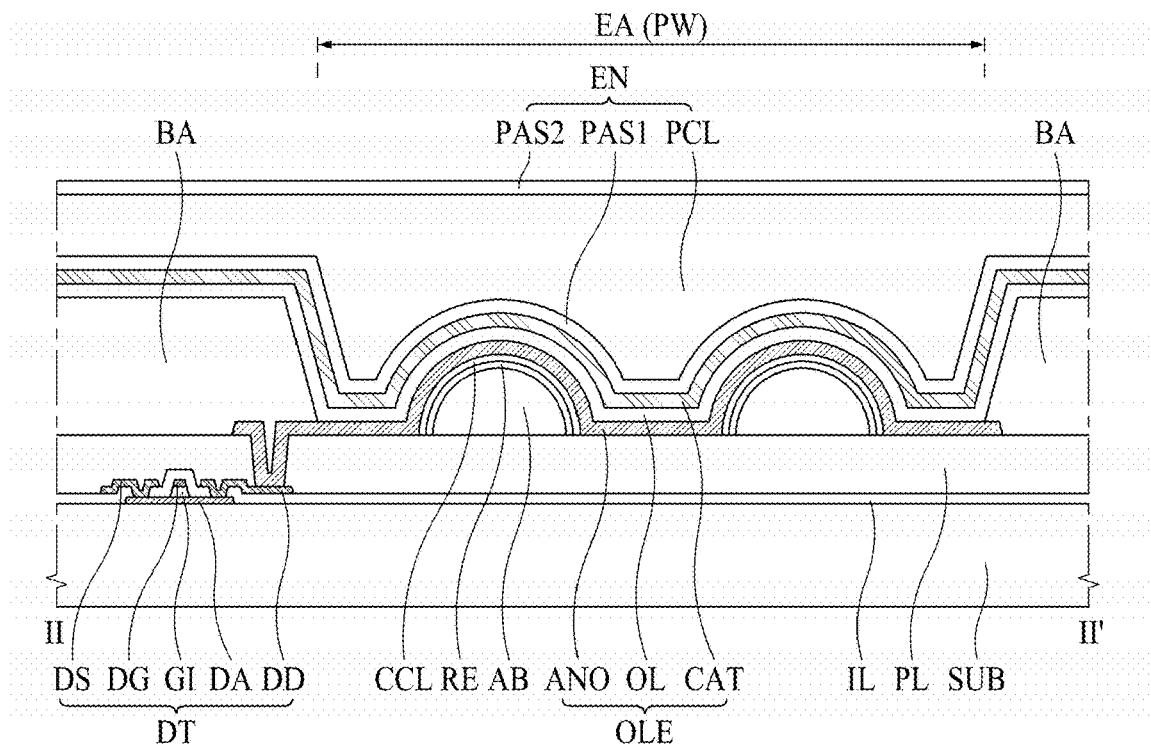
FIG. 7 is a cross-sectional view along the cutting line II-II' in FIG. 3, for illustrating a structure of the electroluminescence display according to the third example embodiment of the present disclosure.

Hereinafter, with reference to FIG. 7, the third example embodiment of the present disclosure will be described. FIG. 7 is a cross-sectional view along the cutting line II-II' in FIG. 3 for illustrating a structure of the electroluminescent display according to the third example embodiment of the present disclosure. An electroluminescence display according to the third example embodiment may have a structure similar to that of the first example embodiment. Therefore, a description of similar elements may not be repeated, and the following description will be focused more on the features and structures different from those of the first example embodiment.

As shown in FIG. 7, an electroluminescence display according to the third example embodiment of the present disclosure may comprise a driving thin film transistor DT, a light emitting diode OLE, a light absorbing element AB, a light reflecting layer RE, and a color temperature control layer CCL, on a substrate SUB. FIG. 7 illustrates an example structure of a white subpixel PW including the light absorbing element AB, the light reflecting layer RE, and the color temperature control layer CCL.

The planarization layer PL may be deposited on the substrate SUB having the driving thin film transistor DT thereon. On the planarization layer PL, the light absorbing element AB may be disposed within the emission area EA. The light absorbing element AB may have semi-spherical shape in a vertical cross-sectional view, for example, as shown in FIG. 7. In a plan view, the light absorbing element AB may have a shape of a rectangle, a pentagon, a circle, or an ellipse. FIG. 3 illustrates that the light absorbing element AB may have a circular shape in a plan view.

The light absorbing element AB may include a light absorbing material for absorbing the external light incident on the bottom surface of the substrate SUB. For example, the light absorbing element AB may be made of a black resin material. The light absorbing element AB may be one island shaped body disposed within the emission area EA. Alternatively, as shown in FIG. 7, the light absorbing element AB may be a plurality of bodies having an island shape and arranged within the emission area EA.

The light reflecting layer RE may be deposited on the top surface of the semi-spherical shape of the light absorbing element AB. The light reflecting layer RE may be made of a metal material, such as silver (Ag), aluminum (Al) or copper (Cu).

The color temperature control layer CCL may be deposited on the light reflecting layer RE. The color temperature control layer CCL may be disposed over the whole surface of the light absorbing element AB and the light reflecting layer RE having the semi-spherical shape.

On the planarization layer PL, the anode electrode ANO may be formed as having an area slightly larger than the emission area EA and covering the emission area EA. The anode electrode ANO may fully overlap with the light absorbing element AB, the light reflecting layer RE, and the color temperature control layer CCL, in the emission area EA.

The bank BA may be formed on the anode electrode ANO to define the emission area EA. The bank BA may be spaced apart from the semi-spherical parts of the light absorbing element AB, the light reflecting layer RE, and the color temperature control layer CCL. In the event that the bank BA is too close to the semi-spherical parts of the light absorbing element AB, the light reflecting layer RE, and the color temperature control layer CCL, the light emitting layer OL may be damaged at the boundary portion with the bank BA.

The light emitting layer OL may be formed on the bank BA and the anode electrode ANO. For the case in which the light emitting layer OL emits white light, the light emitting layer OL may be deposited to cover the entire display area DA of the substrate SUB.

The cathode electrode CAT may be formed on the light emitting layer OL. The cathode electrode CAT may have a single continuous layer structure covering the entire pixel areas over the substrate SUB.

The light absorbing element AB may absorb the light incident on the bottom surface of the substrate SUB, so the reflection of external light can be suppressed. The light reflecting layer RE disposed on the upper surface of the light absorbing element AB may reflect the light emitted from the light emitting layer OL disposed on the light absorbing element AB toward the light absorbing element AB back toward the cathode electrode CAT before being absorbed by the light absorbing element AB. Therefore, even where the light absorbing element AB occupies as much as 90% of the emission area EA, the light radiated from the light emitting layer OL may go out to the substrate SUB by passing through the portions where there is no light absorbing element AB, due to the repeated reflection between the cathode electrode CAT and the light reflecting layer RE.

All the light from the light emitting layer OL may be reflected by the cathode electrode CAT and the light reflecting layer RE, and then may be radiated to the anode electrode ANO. During the reflection by the light reflecting layer RE, some amount of the light may pass through the color temperature control layer CCL. As a result, the color temperature of the light radiated from the emission area EA may be converted or changed.

For example, the color temperature control layer CCL may include a material converting the blue light into the yellow light. Adjusting the area ratio of the color temperature control layer CCL to the emission area EA, the color temperature of the light radiated from the emission area EA of the white subpixel PW may be adjusted variously.

As one example for adjusting the area ratio of the color temperature control layer CCL to the emission area EA, the maximum area of the light absorbing element AB in a plan view may be adjusted. For example, the maximum area of the light absorbing element AB in a plan view may be selected from between 10% and 90% of the areal size of the emission area EA. Here, the maximum area of the light absorbing element AB in a plan view may be referred to the area where the light absorbing element AB contacts the planarization layer PL.

The area ratio of the area of the light absorbing element AB in a plan view to the area of the emission area EA may be set in proportion to the area ratio of the color temperature control layer CCL to the area of the emission area EA.

In the third example embodiment, it has been described that the color temperature may be set differently by the area ratio of the color temperature control layer CCL to the emission area EA. However, the present disclosure is not limited thereto. Even with the same area ratio, the color temperature may be controlled or adjusted differently by varying the thickness of the color temperature control layer CCL or by varying the density of the color temperature conversion material included in the color temperature control layer CCL.

In the example pixel configuration as shown in FIG. 3, the light absorbing element AB, the light reflecting layer RE, and the color temperature control layer CCL may be disposed only at the white subpixel PW. In another example, the light absorbing element AB, the light reflecting layer RE, and the color temperature control layer CCL may be further disposed at any one or both of the red subpixel PR and the green subpixel PG. However, in this example, it may be preferable that the light absorbing element AB, the light reflecting layer RE, and the color temperature control layer CCL are not disposed at the blue subpixel PB.

The color temperature control layer CCL disposed at the red subpixel PR may include a color conversion material converting the blue light into the red light. The color temperature control layer CCL disposed at the green subpixel PG may include a color conversion material converting the blue light into the green light. In another example, the color temperature control layer CCL disposed at the white subpixel PW may include at least one of a color conversion material converting the blue light into the yellow light, a color conversion material converting the blue light into the red light, and a color conversion material converting the blue light into the green light.

<Fourth Example Embodiment>

Figure 8:
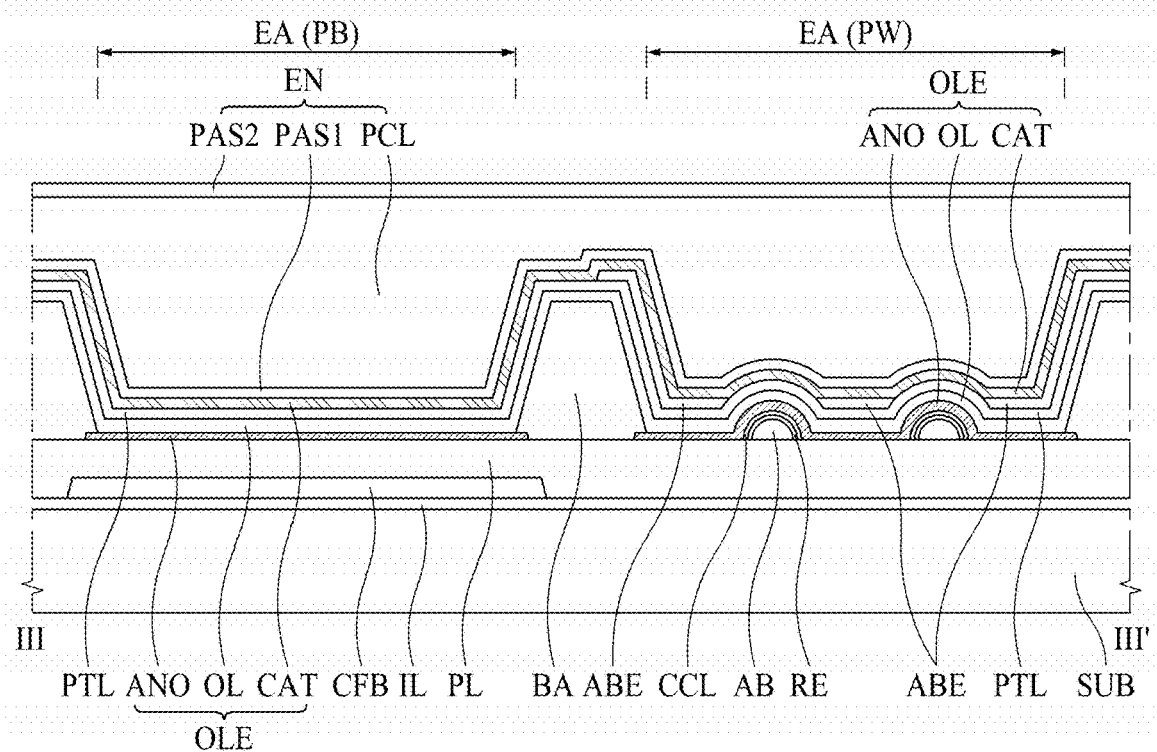
FIG. 8 is a cross-sectional view along the cutting line III-III' in FIG. 3, for illustrating a structure of the electroluminescence display according to the fourth example embodiment of the present disclosure.

Hereinafter, with reference to FIG. 8, the structure of an electroluminescence display according to the fourth example embodiment of the present disclosure will be explained. FIG. 8 is a cross-sectional view along the cutting line III-III' in FIG. 3 for illustrating a structure of the electroluminescence display according to the fourth example embodiment of the present disclosure.

An electroluminescence display according to the fourth example embodiment may have a structure similar with that of the third example embodiment. The differences between these two example embodiments may include an additional structure to suppress the external light reflection. The additional structure for suppressing the external light reflection may be similar with that of the second example embodiment as shown in FIG. 6. In the following description, a description of the same or similar elements described above with respect to the second example embodiment or the third example embodiment may not be repeated here.

An electroluminescence display according to the fourth example embodiment may include a structure for suppressing an external light reflection without including any additional optical element. As shown in FIG. 8, the electroluminescence display according to the fourth example embodiment may include a blue subpixel PB and a white subpixel PW. The blue subpixel PB and the white subpixel PW may have a different structure from each other.

The white subpixel PW may include a driving thin film transistor ST, a light emitting diode OLE, a light absorbing element AB, a light reflecting layer RE, a color temperature control layer CCL, a pattern layer PTL, and a light absorbing electrode layer ABE, on a substrate SUB. The blue subpixel PB may include the pattern layer PTL, but not the light absorbing element AB, the light reflecting layer RE, the color temperature control layer CCL, or the light absorbing electrode layer ABE.

In the white subpixel PW, the planarization layer PL may be deposited on the substrate SUB having the driving thin film transistor DT thereon. On the planarization layer PL, the emission area EA of the white subpixel PW may include the light absorbing element AB, the light reflecting layer RE, and the color temperature control layer CCL.

Further, on the planarization layer PL, the anode electrode ANO may be formed as having a slightly larger area than the emission area EA and fully covering the emission area EA. The anode electrode ANO may overlap with the light absorbing element AB, the light reflecting layer RE, and the color temperature control layer CCL, in the emission area EA of the white subpixel PW.

The bank BA may be formed on the anode electrode ANO to define the emission area EA. The light emitting layer OL may be disposed on the bank BA and the anode electrode ANO to cover the entire display area DA over the substrate SUB.

On the light emitting layer OL, a reflection reduction element may be disposed. In one example, the reflection reduction element may include the pattern layer PTL and the light absorbing electrode layer ABE, sequentially stacked in the white subpixel PW.

The pattern layer PTL may include a transparent conductive material. The pattern layer PTL may have a property of adsorbing or not adsorbing a specific metal material on the surface of the pattern layer PTL, depending on whether or not ultra-violet (or UV) ray (or light) is irradiated. The pattern layer PTL may be made of a single layer covering all pixel areas over the substrate SUB.

After a mask is deposited to expose areas of the pattern layer PTL over the light absorbing element AB in the white subpixel PW, ultra-violet light may be irradiated. After that, an opaque light absorbing metal material may be deposited on the pattern layer PTL. Here, the light absorbing electrode layer ABE may be selectively formed only at the areas in the white subpixel PW where the light absorbing element AB is not disposed, that is, only on the areas of the pattern layer irradiated with the ultra-violet ray. As described above, the light absorbing metal material may be laminated on the regions of the pattern layer PTL irradiated with the ultra-violet ray, but not on the regions not irradiated with the ultra-violet ray.

The cathode electrode CAT may be deposited on the light absorbing electrode layer ABE. The cathode electrode CAT may be deposited as covering all of the pixel areas over the substrate SUB.

For example, 50% of the light radiated from the light emitting layer OL in the white subpixel PW may go directly toward the anode electrode ANO, and the other 50% may go toward the cathode electrode CAT. A portion of the light going toward the anode electrode ANO may pass through the anode electrode ANO and directly go out through the substrate SUB. However, another portion of the light going to the anode electrode ANO, i.e., the portion of the light going to the light absorbing element AB, may pass through the color temperature control layer CCL so that the color temperature may be changed. In addition, the light with the changed color temperature may be reflected by the light reflecting layer RE and then may go to the cathode electrode CAT. This light may again be reflected by the cathode electrode CAT and then go to the anode electrode ANO.

As the light reflecting layer RE has a semi-spherical shape, the light reflected between the light reflecting layer RE and the cathode electrode CAT may have the light paths diffused from the center of the semi-sphere. As a result, the reflected light may go out through the substrate SUB through the portions of the anode electrode ANO where there is no light absorbing element AB. The color temperature of the light reflected between the light reflecting layer RE and the cathode electrode CAT may be converted or changed as the light passes through the color temperature control layer CCL.

The blue subpixel PB may have the same structure of the blue subpixel PB of the second example embodiment. Therefore, the light radiated from the light emitting layer OL in the blue subpixel PB may go out through the substrate SUB according to the mechanism described above in the second example embodiment. Thus, the detailed explanation for the blue subpixel PB is not repeated here.

In the example pixel structure shown in FIG. 3, the white subpixel PW may include the light absorbing electrode layer ABE. In another example, any one or both of the red subpixel PR and the green subpixel PG may also include the light absorbing electrode layer ABE. However, in this example embodiment, it may be preferable that the blue subpixel PB does not have the light absorbing electrode layer ABE because the blue subpixel PB may have a lower reflective index to the external light than the other subpixels.

In FIG. 8, the light absorbing electrode layer ABE may be disposed as not overlapping with the light absorbing element AB. As the light absorbing electrode layer ABE and the light absorbing element AB may both suppress the external light reflection, it may not be necessary for these two elements to overlap each other. In an example where the light absorbing electrode layer ABE is further disposed between the light absorbing element AB and the cathode electrode CAT, the light from the light emitting layer OL to the cathode electrode CAT or from the light reflecting layer RE to the cathode electrode CAT may be absorbed by the light absorbing electrode layer ABE. In that case, the luminance efficiency of the light emitting layer OL may be reduced or degraded. Thus, in this example embodiment, it may be preferable that the light absorbing electrode layer ABE is disposed not to overlap with the light absorbing element AB. However, the present disclosure is not limited thereto. For example, in the event that the light absorbing electrode layer ABE is formed of a material having a relatively low light absorption index, the light absorbing electrode layer ABE may be disposed to overlap with the light absorbing element AB.

<Fifth Example Embodiment>

Figure 9:
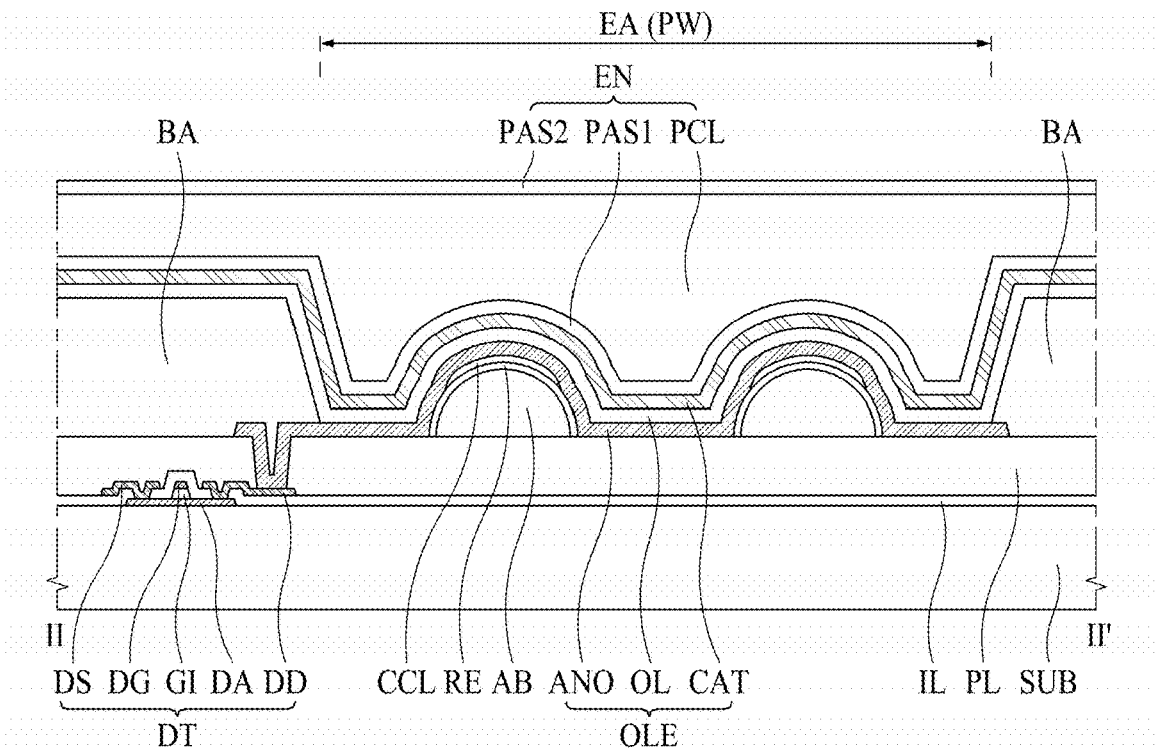
FIG. 9 is a cross-sectional view along the cutting line II-II' in FIG. 3, for illustrating a structure of the electroluminescence display according to the fifth example embodiment of the present disclosure.

Hereinafter, with reference to FIG. 9, the structure of an electroluminescence display according to the fifth example embodiment of the present disclosure will be explained. FIG. 9 is a cross-sectional view along the cutting line II-II' in FIG. 3 for illustrating a structure of the electroluminescence display according to the fifth example embodiment of the present disclosure.

An electroluminescence display according to the fifth example embodiment of the present disclosure shown in FIG. 9 may have a structure similar to the structure of the third example embodiment shown in FIG. 7. A difference may be in the structure of the color temperature control layer CCL. Therefore, a description of the same or similar elements or features described above may not be repeated here, and the different features of the fifth example embodiment may primarily be explained.

As shown in FIG. 9, an electroluminescence display according to the fifth example embodiment of the present disclosure may comprise a substrate SUB, a driving thin film transistor DT, a light emitting diode OLE, a light absorbing element AB, a light reflecting layer RE, and a color temperature control layer CCL.

The light absorbing element AB may be disposed in the emission area EA of the white subpixel PW on the planarization layer PL. The light absorbing element AB may have a semi-spherical shape. On the top surface of the light absorbing element AB, the light reflecting layer RE may be deposited. The light reflecting layer RE may be formed to cover the curved surface of the light absorbing element AB.

The color temperature control layer CCL may be deposited on the light reflecting layer RE. In particular, the color temperature control layer CCL may be disposed only on some portions of the light reflecting layer RE.

As the color temperature control layer CCL is provided for adjusting the color temperature of the light radiated from the light emitting layer OL, the volume content of the color temperature control layer CCL may be adjusted to 10% to 50% of the volume content of the light emitting layer OL. For example, the color temperature control layer CCL may be formed of a material in which a base organic material is mixed with a color conversion material. Since the color conversion material is provided for converting the color temperature, it may be preferable to adjust the volume content of the color conversion material to 10% to 50% of the volume content of the light emitting layer OL.

In an example where the color temperature control layer CCL having a specific volume content of the color conversion material is used, the color temperature may be controlled variously by adjusting the area of the color temperature control layer CCL. For example, in the event that the light absorbing element AB has an area ratio of 50% to the area of the emission area EA (for example, in a plan view), the color temperature control layer CCL may be deposited to have a 40% area ratio to the area of the light absorbing element AB. As a result, the color temperature control layer CCL may have a 20% area ratio to the emission area EA. Here, in the event that the volume content of the color conversion material included in the color temperature control layer CCL is 50%, the color conversion material may have a 10% volume content ratio to the light emitting layer OL in the emission area EA. In one example, in the event that a light emitting layer OL with a color temperature of 9969° C. is deposited and a color conversion material for converting blue light into yellow light is disposed in the white subpixel PW, the color temperature of the white subpixel PW may be adjusted to 7379° C. by the color temperature control layer CCL.

<Sixth Example Embodiment>

Figure 10:
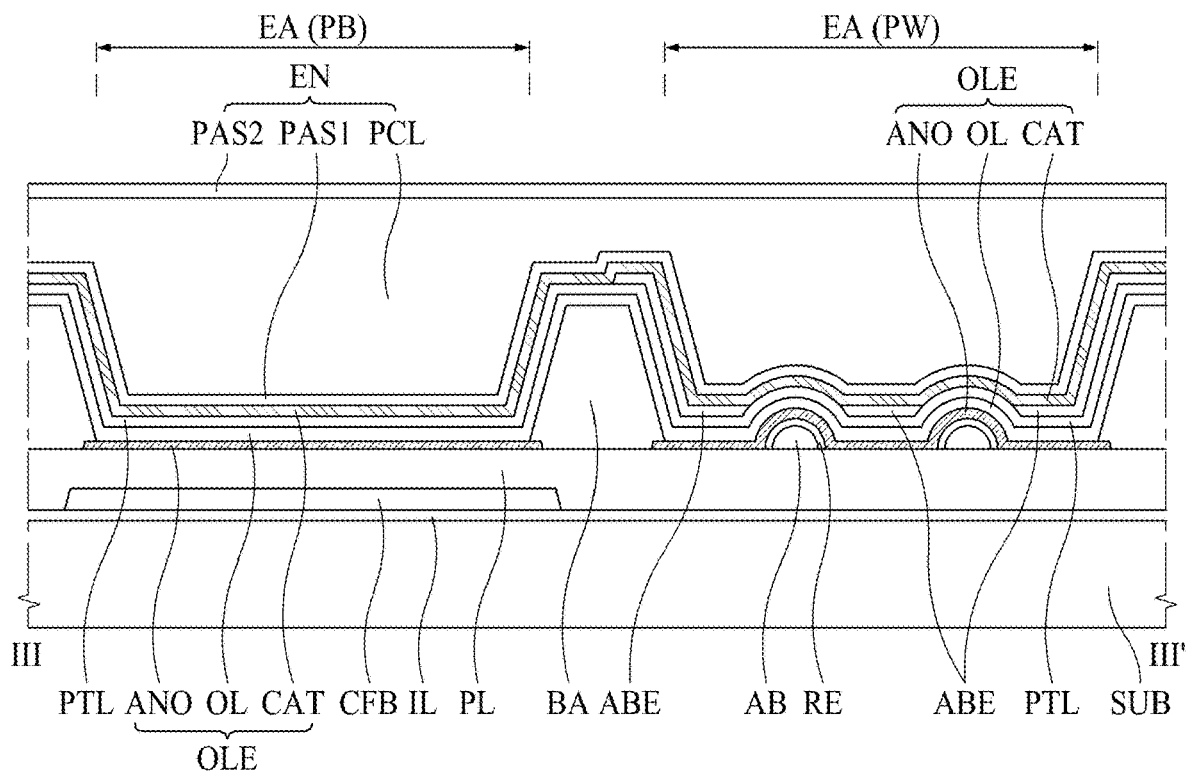
FIG. 10 is a cross-sectional view along the cutting line III-III' in FIG. 3, for illustrating a structure of the electroluminescence display according to the sixth example embodiment of the present disclosure.

Hereinafter, with reference to FIG. 10, the structure of an electroluminescence display according to the sixth example embodiment of the present disclosure will be described. FIG. 10 is a cross-sectional view along the cutting line III-III' in FIG. 3 for illustrating a structure of the electroluminescence display according to the sixth example embodiment of the present disclosure.

An electroluminescence display according to the sixth example embodiment of the present disclosure shown in FIG. 10 may have a similar structure to the fourth example embodiment shown in FIG. 8. A difference is that the electroluminescence display according to the sixth example embodiment does not include the color temperature control layer CCL.

As the electroluminescence display according to the sixth example embodiment does not have the color temperature control layer CCL, it is not configured to convert or change the color temperature. The electroluminescence display according to the sixth example embodiment may have a structure mainly for suppressing the external light reflection.

The light absorbing element AB may be an element for suppressing the external light reflection by absorbing the external light incident on the substrate SUB from the external environment. Therefore, it may be preferable that the light absorbing element AB have as large an area as possible in the emission area EA. For example, it may be preferable that the area ratio of the light absorbing element AB to the emission area EA (e.g., in a plan view) be between 50% to 90%. In the event that the area ratio of the light absorbing element AB to the emission area EA is less than 50%, the efficiency for suppressing the external light reflection may be degraded. In the event that the area ratio of the light absorbing element AB to the emission area EA is more than 90%, the luminance efficiency may be degraded, because the area for transmitting the light reflected between the light reflecting layer RE and the cathode electrode CAT after being radiated from the light emitting layer OL may be too small.

At the regions where there is no light absorbing element AB, the external light may be reflected by the cathode electrode CAT. To prevent or reduce this light reflection, a reflecting reduction element may be further disposed where there is no light absorbing element AB.

For example, the reflecting reduction element may have a structure in which the pattern layer PTL and the light absorbing electrode layer ABE are stacked. The pattern layer PTL may include a transparent conductive material. The pattern layer PTL may have a property of adsorbing or not adsorbing a specific metal material on the surface of the pattern layer PTL, depending on whether or not ultra-violet (or UV) ray (or light) is irradiated. The pattern layer PTL may be made of single layer covering all pixel areas over the substrate SUB. When ultra-violet ray is irradiated to a predetermined region or regions on the surface of the pattern layer PTL, the light absorbing metal material may be laminated on the region(s) irradiated with the ultra-violet ray. However, the light absorbing metal material may not be laminated on the region(s) not irradiated with the ultra-violet ray.

After a mask is deposited to expose areas of the pattern layer PTL over the light absorbing element AB in the white subpixel PW, ultra-violet light may be irradiated. After that, an opaque light absorbing metal material may be deposited on the pattern layer PTL. Here, the light absorbing electrode layer ABE may be selectively formed only at the areas in the white subpixel PW where the light absorbing element AB is not disposed, that is, only on the areas of the pattern layer irradiated with the ultra-violet ray. As described above, the light absorbing metal material may be laminated on the regions of the pattern layer PTL irradiated with the ultra-violet ray, but not on the regions not irradiated with the ultra-violet ray. The light absorbing electrode layer ABE may include any one of chromium (Cr), molybdenum (Mo), magnesium (Mg), or any alloy thereof.

The cathode electrode CAT may be deposited on the light absorbing electrode layer ABE. The cathode electrode CAT may be deposited to cover all of the pixel areas over the substrate SUB. Therefore, the pattern layer PTL, the light absorbing electrode layer ABE, and the cathode electrode CAT may be electrically connected with one another and may collectively function as a counter electrode to the anode electrode ANO.

In the event that the area ratio of the light absorbing element AB to the emission area EA is 50%, 50% of the light radiated from the light emitting layer OL may go out through the substrate SUB through the regions where there is no light absorbing element AB. The other 50% of the light transmitted toward the light absorbing element AB may be reflected by the light reflecting layer RE disposed on the light absorbing element AB and be returned to the cathode electrode CAT. As the light reflecting layer RE has a semi-spherical shape, the reflected light may be directed toward the cathode electrode CAT after being spread out in a semi-circular manner. Most of the light reflected by the light reflecting layer RE may be re-reflected by the cathode electrode CAT toward the substrate SUB. Even though a small amount of the re-reflected light may be returned to the light reflecting layer RE again, this small amount of light may be re-reflected by the light reflection layer RE and then be re-reflected by the cathode electrode CAT again, so that all of the light may eventually go out through the substrate SUB.

Consequently, in the electroluminescence display according to the sixth example embodiment, most of the external light incident from the outside environment may be absorbed by the light absorbing element AB and the light absorbing electrode layer ABE so that the external light reflection can be suppressed. Further, the light radiated from the light emitting layer OL may go out through the substrate SUB without loss by the repeated reflections between the cathode electrode CAT and the light reflecting layer RE in the white subpixel PW.

In this example embodiment, the blue subpixel PB does not include the light absorbing element AB, the light reflecting layer RE, or the light absorbing electrode layer ABE. Therefore, in the blue subpixel PB, all the light radiated from the light emitting layer OL may go out through the substrate SUB, directly or after being reflected by the cathode electrode CAT.

On the light emitting layer OL in the blue subpixel PB, the pattern layer PTL may be disposed. The pattern layer PTL may be deposited to cover all the pixel areas and as a single continuous layer over the substrate SUB. In order not to deposit the light absorbing electrode layer ABE in the blue subpixel PB, ultra-violet light may be irradiated using a mask covering the pattern layer PTL in the blue subpixel PB area and exposing areas of the pattern layer PTL in the white subpixel PW area. After that, an opaque light absorbing metal material may be deposited on the pattern layer PTL. Then, the light absorbing electrode layer ABE may be selectively formed in the areas in the white subpixel PW area where the ultra-violet light was irradiated on the pattern layer PTL, without being formed in the blue subpixel PB area.

The light incident on the blue subpixel PB area from outside the substrate SUB may be reflected by the cathode electrode CAT. However, the blue subpixel PB may have a blue color filter CFB. In the event that the external light is incident on the blue subpixel PB, the luminance of the external light may be reduced by the blue color filter CFB. Further, the luminance of the external light may be reduced again after being reflected by the cathode electrode CAT and passing through the blue color filter CFB. Accordingly, at the subpixel having the color filter, the external light reflection may be substantially reduced by the color filter. Especially, at the blue subpixel PB having the blue color filter CFB, the external light reflection may be reduced more than at other subpixels having other color filters.

The electroluminescence display according to the sixth example embodiment having the example pixel structure shown in FIG. 3 may suppress the external light reflection by the light absorbing element AB, the light reflecting layer RE, and the light absorbing electrode layer ABE disposed in the white subpixel PW. However, the present disclosure is not limited thereto. At least one of the green subpixel PG and the red subpixel PR may also include the light absorbing element AB, the light reflecting layer RE, and the light absorbing electrode layer ABE. In this example, it may be preferable that the blue subpixel PB does not have the light absorbing element AB, the light reflecting layer RE, or the light absorbing electrode layer ABE because the blue subpixel may have a lower luminance than the other subpixels.

Figure 11:
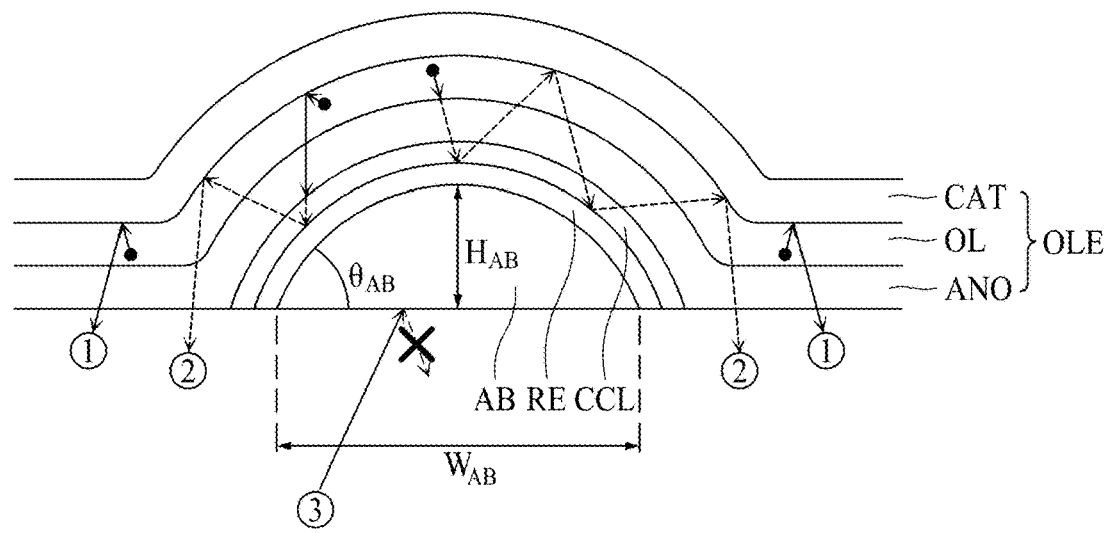
FIG. 11 is a cross-sectional view illustrating a mechanism for controlling the color temperature and suppressing the reflection of external light in an electroluminescence display having a light absorber according to an example embodiment of the present disclosure.

Hereinafter, with reference to FIG. 11 and FIG. 7, the mechanism of color temperature control and the external light reflection suppression in case of example embodiments having the light absorbing element according to the present disclosure will be described. FIG. 11 is a cross-sectional view illustrating a mechanism for controlling the color temperature and suppressing the reflection of external light in an electroluminescence display having a light absorbing element according to example embodiments of the present disclosure.

As shown in FIG. 11, an electroluminescence display according to example embodiments of the present disclosure may include a light absorbing element AB, a light reflecting layer RE, a color temperature control layer CCL, an anode electrode ANO, a light emitting layer OL, and a cathode electrode CAT. The anode electrode ANO, the light emitting layer OL, and the cathode electrode CAT may configure a light emitting diode OLE.

The light absorbing element AB may be made of an organic material such as black resin. The light absorbing element AB may have a semi-spherical shape having a width $W_{AB}$ and a height $H_{AB}$. It may have a perfect semi-spherical shape, but it is not limited thereto. The width $W_{AB}$ may be at least 1 µm. The maximum width $W_{AB}$ may be defined by the area ratio of the light absorbing element AB to the area of the emission area EA. For example, in the event that the width of the emission area EA is 200 µm, the area ratio of the light absorbing element AB to the emission area EA is 50% (e.g., in a plan view), and one light absorbing element AB is disposed within one emission area EA, the width $W_{AB}$ of the light absorbing element AB may be 100 µm. For another example, in the event that two light absorbing elements AB are disposed within one emission area EA, the width $W_{AB}$ of one light absorbing element AB may be 50 µm.

The height of $H_{AB}$ of the light absorbing element AB may be set according to the height of the bank BA defining the emission area EA and/or light emitting diode OLE. For example, the bank BA may have any height from 0.5 µm to 50 µm, according to the specification of the electroluminescence display. Then, the height $H_{AB}$ of the light absorbing element AB may be from 0.1 µm to 5 µm. The light absorbing element AB may have a bottom surface contacting the planarization layer PL and a curved top surface contacting the anode electrode ANO. Here, the base angle $\Theta_{AB}$ between the bottom surface and the curved top surface may be from 20° to 70°.

In the event that the light is first radiated from the light emitting layer OL, it is radially radiated in all directions. The portion of the light forwarded to the cathode electrode CAT from the light emitting layer OL may be reflected by the cathode electrode CAT toward the anode electrode ANO. Accordingly, most of all light radiated from the light emitting layer OL may go to the anode electrode ANO.

Of the light directed toward the anode electrode ANO, the light transmitted to the area where there is no light absorbing element AB may pass through the anode electrode ANO and go out through the substrate SUB, for example, following the light path ① as shown by the solid arrow in FIG. 11. On the other hand, the light forwarded toward the light absorbing element AB may be reflected by the light reflecting layer RE. Particularly, this light passes through the color temperature control layer CCL before and after being reflected by the light reflecting layer RE, so the color temperature of this light is converted or changed.

The light reflected by the light reflecting layer RE may be reflected again by the cathode electrode CAT and go toward the anode electrode ANO. As the light reflecting layer RE has the semi-spherical or similar shape, the reflected light may be spread out toward the cathode electrode CAT. That is, the reflected lights may be radially diffused or radiated. Therefore, the light reflected between the light reflecting layer RE and the cathode electrode CAT may be directed to an area where there is no light absorbing element AB. Some of light may be directed toward the light absorbing element AB again. However, this light may be reflected by the cathode electrode CAT again and may be directed to an area where there is no light absorbing element AB. That is, after being repeatedly reflected between the light reflecting layer RE and the cathode electrode CAT, the light may eventually pass through the anode electrode ANO and go out through the substrate SUB, for example, following the light path ② as shown by the dotted arrow in FIG. 11.

Among the light incident from the external environment, the light incident on the light absorbing element AB may not be reflected because it may be absorbed by the light absorbing element AB. This light may have the light path ③ as shown in FIG. 11. The 'X' in FIG. 11 means that the external light is not reflected and is absorbed by the light absorbing element AB. Of the light incident from the external environment, some amount incident on the area where there is no light absorbing element AB may be reflected by the cathode electrode CAT. In order to reduce the luminance of the reflected external light, it may be preferable that the area ratio of the light absorbing element AB to the emission area EA (e.g., in a plan view) be equal to or greater than 50%. Further, in order to extract the light radiated from the light emitting layer OL through the area where there is no light absorbing element AB, it may be preferable that the area ratio of the light absorbing element AB to the emission area EA (e.g., in a plan view) be equal to or less than 90%.

As FIG. 11 is an illustration for explaining the mechanism of the light absorbing element AB, there is no light absorbing electrode layer ABE illustrated. However, as described above, the light absorbing electrode layer ABE may be further disposed where there is no light absorbing element AB to further reduce or suppress the external light reflection by absorbing the external light which is not absorbed by the light absorbing element AB.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims.

What is claimed is:

1. An electroluminescence display, comprising:
   a substrate;
   a driving element on the substrate;
   a planarization layer on the driving element;
   an anode electrode on the planarization layer and connected to the driving element;
   a bank on the anode electrode and defining an emission area at the anode electrode;
   a light emitting layer on the bank and the anode electrode;
   a cathode electrode on the light emitting layer;
   a color temperature control layer between the anode electrode and the planarization layer in the emission area;
   a light absorbing element disposed between the color temperature control layer and the substrate; and
   a light reflecting layer disposed between the light absorbing element and the color temperature control layer,
   wherein the color temperature control layer, the light absorbing element, and the light reflecting layer are disposed between the anode electrode and the planarization layer, wherein the color temperature control layer has smaller area than the emission area, wherein the color temperature control layer is configured to convert a color temperature of a light generated from the light emitting layer into a different color temperature, and wherein the light absorbing element has a semi-spherical shape in a cross section with a curved top surface.

2. The electroluminescence display of claim 1, wherein an area ratio of the color temperature control layer to the emission area in a plan view is 10% to 50%.

3. The electroluminescence display of claim 1, wherein the color temperature control layer has a plurality of island patterns arranged in the emission area.

4. The electroluminescence display of claim 1, further comprising:

a light absorbing electrode layer disposed between the light emitting layer and the cathode electrode without overlapping, in a plan view, with the light reflecting layer.

5. The electroluminescence display of claim 1, wherein a ratio of a maximum area of the light absorbing element to the emission area in a plan view is 10% to 90%.

6. The electroluminescence display of claim 1, wherein the light reflecting layer is disposed on the light absorbing element, and wherein the color temperature control layer is disposed on a portion of the light reflecting layer.

7. The electroluminescence display of claim 1, wherein the substrate has a plurality of pixels arranged in a matrix pattern, each pixel including a red subpixel, a green subpixel, and a blue subpixel, and wherein the color temperature control layer is disposed in at least one of the red subpixel and the green subpixel.

8. The electroluminescence display of claim 7, wherein each pixel further includes a white subpixel, and wherein the color temperature control layer is further disposed in the white subpixel.

9. The electroluminescence display of claim 1, wherein the color temperature control layer includes at least one of a first color conversion material to convert blue light to yellow light, a second color conversion material to convert blue light to red right, and a third color conversion material to convert blue light to green light.

* * * * *